(12) United States Patent
Barrow

(10) Patent No.: US 6,747,362 B2
(45) Date of Patent: Jun. 8, 2004

(54) PERIMETER MATRIX BALL GRID ARRAY CIRCUIT PACKAGE WITH A POPULATED CENTER

(75) Inventor: Michael Barrow, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/274,430

(22) Filed: Mar. 22, 1999

(65) Prior Publication Data

US 2002/0057558 A1 May 16, 2002

Related U.S. Application Data

(63) Continuation of application No. 08/959,546, filed on Oct. 24, 1997, now Pat. No. 5,894,410, which is a continuation of application No. 08/623,355, filed on Mar. 28, 1996, now abandoned.

(51) Int. Cl.$^7$ ............................................. H01L 23/488
(52) U.S. Cl. ........................ 257/786; 257/691; 257/738; 257/778; 174/260; 174/262
(58) Field of Search ................................. 257/690, 693, 257/700, 723, 724, 730, 747, 778, 787, 691, 698, 737, 738, 786; 361/704, 707, 719, 720, 760, 772, 777, 783; 228/180.21, 180.22; 174/250, 253, 260–262

(56) References Cited

U.S. PATENT DOCUMENTS

| | | | |
|---|---|---|---|
| 4,688,170 A | | 8/1987 | Waite et al. |
| 4,887,148 A | | 12/1989 | Mu |
| 5,216,278 A | * | 6/1993 | Lin et al. ..................... 257/688 |
| 5,285,352 A | * | 2/1994 | Pastore et al. ............... 361/707 |
| 5,309,024 A | * | 5/1994 | Hirano ......................... 257/665 |
| 5,324,985 A | * | 6/1994 | Hamada et al. .............. 257/697 |

(List continued on next page.)

OTHER PUBLICATIONS

Texas Instruments, Semiconductor Group Package Outlines, Reference Guide, 1996.

1991 Proceedings, 41$^{st}$ Electronic Components & Technology Conference, May 11–16, 1991, Atlanta, Georgia.

Bruce Freyman et al., Surface Mount Process Technology for Ball Grid Array Packaging, Amkor Electronics Inc., Tempe, Arizona, pp. 81–85.

Bruce Freyman et al., "Surface Mount Process Technology for Ball Grid Array Packaging"; JUNICHO SHIMIZU, "Plastic Ball Grid Array Coplanrity" Citizens Watch Co, Tokoy Japan, Surface Mount International Conference & Exposition, San Jose, California, Aug. 29–Sep. 2, 1993, pp. 81–91.

Dave Hattas, "BGAs Face Production Testing", Advanced Packaging, Summer 1993, pp. 44–46.

(List continued on next page.)

*Primary Examiner*—David J. Talbott
*Assistant Examiner*—John B. Vigushin
(74) *Attorney, Agent, or Firm*—Blakely, Sokoloff, Taylor & Zafman LLP

(57) ABSTRACT

A ball grid array (BGA) integrated circuit package which has an outer two-dimensional array of solder balls and a center two-dimensional array of solder balls located on a bottom surface of a package substrate. The solder balls are typically reflowed to mount the package to a printed circuit board. Mounted to an opposite surface of the substrate is an integrated circuit that is electrically coupled to the solder balls by internal routing within the package. The outer array of solder balls are located the dimensional profile of the integrated circuit to reduce solder stresses induced by the differential thermal expansion between the integrated circuit and the substrate. The center solder balls are typically routed directly to ground and power pads of the package to provide a direct thermal and electrical path from the integrated circuit to the printed circuit board.

30 Claims, 1 Drawing Sheet

U.S. PATENT DOCUMENTS

| | | | |
|---|---|---|---|
| 5,355,283 A | * 10/1994 | Marrs et al. | 361/760 |
| 5,367,435 A | 11/1994 | Andros et al. | |
| 5,450,283 A | * 9/1995 | Lin et al. | 361/704 |
| 5,477,082 A | * 12/1995 | Buckley et al. | 257/679 |
| 5,490,324 A | * 2/1996 | Newman | 29/830 |
| 5,495,397 A | * 2/1996 | Davidson et al. | 361/784 |
| 5,506,756 A | 4/1996 | Haley | |
| 5,650,660 A | 7/1997 | Barrow | |
| 5,686,699 A | 11/1997 | Chu et al. | |
| 5,729,894 A | * 3/1998 | Rostoker et al. | 257/693 |
| 5,731,630 A | * 3/1998 | Suyama et al. | 257/701 |
| 5,741,729 A | * 4/1998 | Selna | 438/125 |
| 5,895,968 A | * 4/1999 | Barber | 257/691 |

OTHER PUBLICATIONS

Electronic Packaging & Production: Concurrent Engineering for Packaging Fabrication & Assembly, Articles, Mar. 1993, vol. 3, No. 33.

Julie Houghten, "Takes on QFPs" Advanced Packaging, Winter 1993, pp. 38–39.

Randy Johnson et al., "Ball Grid Array Technology: A Feasibility Study of Ball Grid Array Packaging", Nepcon Conference, Proceeding of the Technical Program, Jun. 14–17, 1993 Boston Massachusetts, pp. 411–430.

Electronic Packaging & Production: Concurrent Engineering for Packaging, Fabrication & Assembly, Articles, May 1992.

Andrew Mawer et al., "Calculation of Thermal Cycling and Applications Fatigue Life of the Plastic Ball Grid Array (BGA) Package", Proceeding of the 1993 International Electronics Packaging Conference, Sep. 12–15, 1993 San Diego, California, vol. 2, pp. 718–730.

Amkor BGA Packaging, "Taking the World by Storm", Amkor Electronics, Chandler, AZ.

Leo Anderson et al., "Solder Attachment Analysis of Plastic BGA Modules", Surface Mount International, San Jose, CA, Aug. 1994, pp. 189–194.

Dr. Abbas I. Attarwala et al., "Failure Mode Analysis of a 540 Pin Plastic Ball Grid Array", Surface Mount International, San Jose, CA, Aug. 1994, pp. 252–257.

Surface Mount International Conference & Exposition: Proceedings of The Technical Program, San Jose, CA, Aug. 28–Sep. 1, 1994.

C.E. Bauer, "Partioning and Die Selection Strategies for Cost Effective MCM Designs", W.E. Bernier et al., "BGA vs QFP: A Summary of Tradeoffs for Selection of High I/O Components"; A.J. Mawer et al., "Plastic Ball Grid Array Solder Joint Reliability Considerations"; Dr. W.C. Mak et al., "Increased SOIC Power Distribution Capability Through Board Design and Finite Element Modeling", Journal of Surface Mount Technology, Oct. 1994.

W.E. Bernier et al., "BGA vs QFP: A Summary of Tradeoffs for Selection of High I/O Components", Surface Mount International Conference & Exposition, Proceedings of The Technical Program, San Jose, CA, Aug. 30–Sep. 1, 1994 pp. 181–185.

Marie Cole et al., "Ball Grid Array Packaging", Surface Mount International Conference & Exposition, Proceedings of The Technical Program, San Jose, CA, Aug. 30–Sep. 1, 1994 pp. 147–153.

Electronic Packaging & Production, Articles, vol. 34, No. 12, Dec. 1994.

Advanced Packaging, "BGAs for MCMs: An Enabling Technology Emerges", Articles, Sep./Oct. 1994.

Suzanne Fauser et al., "High Pin Count PBGA Assembly: Solder Defect Failure Modes and Root Cause Analysis", pp. 169–174.

InterConnection Technology Articles, Sep. 1993.

Curtis Hart, "Vias in Pads for Coarse and Fine Pitch Ball Grid Arrays", Surface Mount International Conference & Exposition, Proceedings of The Technical Program, San Jose, CA, Aug. 30–Sep. 1, 1994.

L.C. Matthew et al. "Reliability– Area Array Packaging"; Roland Heitmann, "Assembly–A Direct Attach Evolution", Advanced Packing, Microwave RF Packaging, Articles, Jul./Aug. 1994.

Charles L.Hutchins "Understanding Grid Array Packages", Surface Mount Technology Magazine, Nov. 1994, pp. 12–13.

Jennie S. Hwang, "Reliability of BGA Solder Interconnections" Surface Mount Technology Magazine, Sep. 1994, pp. 14–15.

J. Lau et al., "No Clean Mass Reflow of Large Plastic Ball Grid Array Packages" Printed Circuit Interconnection Federation, Circuit World, vol. 20, No. 3, Mar. 1994, pp. 15–22.

John H. Lau et al. "No Clean Mass Reflow of Large Plastic Ball Grid Array Packages", Journal of Surface Mount Technology, pp. 3–14, Jul. 1994.

Charles E. Bauer, Ph.D. et al., "Partitioning and Die Selection for Cost Effective MCM Designs", pp. 4–9; W.E. Bernier et al., "BGA vs QFP: A Summary for Tradeoffs for Selection of High I/O Components", pp. 10–15; Andrew J. Mawer et al. "Plastic Ball Grid Array Solder Joint Reliability Considerations", pp. 16–32; Dr. W.C. Mak et al. "Increased SOIC Power Dissipation Capability Through Board Design and Finite Element Modeling", pp. 33–42, Journal of Surface Mount Technology, Oct. 1994.

Michael Dobers et al., "Design–Low Cost MCMs", pp. 28–32; "Ken Gilleo,"Materials–Electronic Polymers, pp. 37–42"; Robert C. Marrs et al,"Market Trends–BGAs for Sep./Oct. 1994.

L.C. Mathew et al. "Reliability–Area Array PackingZ", pp. 91–94; "Assembly–A Direct Attach Evolution", pp. 95–99, Advanced Packing Magazine, Microwave RF Packaging, Jul./Aug. 1994.

Andrew J. Mawer et al, "Plastic Ball Grip Array Solder Joint Reliability Considerations", pp. 16–32, Journal of Surface Mount Technology, Oct. 1994.

Tony Mazzullo, "How IC Packages Affect PCB Design", Surface Mount Technology Magazine, Nepcon West '95, Feb. 1995, pp. 114–116.

Joel Mearig, "An Overview of Manufacturing BGA Technology", Proceedings of the Technical Program, Nepcon West '95 Conference, Feb./Mar. 1995, Anaheim, CA, pp. 295–299.

Atila Mertol, "Application of the Taguchi Method on the Robust Design of Molded 225 Plastic Ball Grid Array Packages", IEEE Transactions on Components, Packaging, and Manufacturing Technology, Part B: vol. 18, No. 4, Nov. 1995, pp. 734–743.

Shailesh Mulgaonker et al., "An Assessment of the Thermal Performance of the PBGA Family", IEEE Transactions on Components, Packaging, and Manufacturing Technology, Part A. vol. 18. No. 4., Dec. 1995, pp. 739–748.

Electronic Design Magazine, Apr. 17, 1995, Various Articles.

Reader Service: Hewlett Packard, Actel, Mini–Circuits; Electronic Design, Apr. 1995, vol. 43, No. 8; Nikkei Microdevices Magazine, Various Articles.

Nikkei Microdevices, Mar. 1995, Various Articles.

John H. Lau, "Ball Grid Array Technology" Publication, pp. 1–636.

Electronic Packaging & Production Literature Review, Feb. 1995.

LSI Logic Package Selector Guide, 1994–1995.

Robert Marrs et al., "Recent Technology Breakthroughs Achieved with the New Super BGA Package", Proceeding of the Technical Conference, 1995 International Electronics Packaging Conference, San Diego, CA Sep. 1995, pp. 565–576.

Jonathan L. Houghten, "Plastic Ball–Grid Arrays Continue to Evolve", Electronic Design Magazine, Feb. 1995, 141–146.

Wayne Huang et al. "Electrical Characteriation of PBGA for Communication Applications by Simulation and Measurement" Proceedings of the Technical Program, Nepcon West '95, Conference Feb./Mar. 1995, Anaheim, CA, pp. 307.

Greg Reed, "NEPCON Highlights Thriving Industry"; Jenny S. Hwang, "A Hybid of QFP and BGA Architectures", Surface Mount Technology Magazine, Feb. 1995.

Microprocessor Report, Nov. 1995, vol. 9, No. 15, Michael Slater "Intel Boosts Pentium Pro to 200 MHz", "AMD Buys NexGen to Boost x86 Position";Linly Gwennap "Integrated PA–7300LC Powers HP Midrange", "UltraSparc to Pick Up Speed in 1996"; Jim Turley "StrongArm Punches Up ARM Performance"; Brian Case "First Trimedia Chip Boards PCI Bus"; and Mike Johnson RISC–like Design Fares Well for x86 CPUs.

Linley Gwennap "Intel's P6 Bus Designed for Multiprocessing" Microprocessor Report, vol. 9, No. 7, May 1995, pp. 2–6.

IPC National Ball Grid Array Symposium, Supplement to the Proceedings, Mar. 1995, Dallas TX.

T. Kawahara et al. "Ball Grid Array Type Package by Using of New Encapsulation Method", Proceedings of the 1995 International Electronics Packaging Conference, San Diego, CA, Sep. 1995.

John U. Knickerbocker et al., "Materials: Ceramic BGA" Advanced Packing Magazine, Jan./Feb. 1995, pp. 20–25.

Gary Kromann et al.; "A Hi–Density C4/CBGA Interconnect Technology for a CMOS Microprocessor", Proceeding of the Technical Program, Nepcon West '95 Conference, Feb./Mar. 1995, Anaheim, CA, pp. 1523–1529.

Balwant S. Lall et al., "Methodology for Thermal Evaluation of Multichip Modules" IEEE Transactions on Components, Packaging, and Manufacturing Technology Part A, Dec. 1995, vol. 18, No. 4, pp. 758–764.

Steve Rooks, "X–Ray Inspection of Flip Chip Attach Using Digital Tomosynthesis" Surface Mount International Conference & Exposition, Proceedings of the Technical Program, San Jose, CA, Aug./Sep. 1994, pp. 195–202.

Paul Mescher et al., "A Practical Comparison of Surface Mount Assembly for Ball Grid Array Components" Surface Mount International, Proceedings of the Technical Program, San Jose, CA, Aug./Sep. 1994, pp. 164–168.

Gil Olachea, "Managing Heat: A Focus On Power IC Packaging" Electronic Packaging & Production, Nov. 1994, pp. 26–28.

C. Ramirez et al., Fatigue Life Comparison of the Perimeter and Full Plastic Ball Grid Array, pp. 258–266.

Steve Rooks, "X–Ray Inspection of Flip Chip Attach Using Digital Tomosynthesis" Surface Mount International Conference & Exposition, Proceedings of the Technical Program, San Jose, CA, Aug./Sep. 1994, pp. 195–202.

Richard E. Sigliano, "Market Trends: Using BGA Packages", Advanced Packaging, Mar./Apr. 1994, pp. 36–40.

David B. Walshak, Jr., "Thermal Modeling of a Multichip BGA Package" Proceedings of the Technical Program, Nepcon West Conference, Feb./Mar. 1994, Anaheim CA, pp. 1266–1276.

David Walshak et al., "BGA Technology: Current and Future Direction for Plastic, Ceramic and Tape BGA"s, MCC, Austin TX, pp 157–163.

J. S. Huang, "Reliability of BGA Solder Interconnections" Electronic Packaging & Production, Surface Mount, vol. 8, No. 9, Sep. 1994, pp 14–15.

Michael A. Zimerman "High Performance BGA Molded Packages for MCM Application" Surface Mount Internationial Conference & Exposition, Proceedings of the Technical Program, San Jose, CA, Aug. 1994, pp 175–180.

Gilbert Zweig, "BGAs: Inspect the Process, Not the Product", Electronic Packaging & Production Magazine, The Technology of Surface Mount, Aug. 1994.

Advanced Packaging, Mar./Apr. 1995.

Seung–Ho Ahn et al., "Popcorn Phenomena in a Ball Grid Array Package" IEEE Transactions on Components, Packaging, and Manufacturing Technology–Part B: Advanced Packaging, vol. 18, No. 3, Aug. 1995, pp 491–496.

Rajen Chanchani et al., "Reliability: Mini BGA", Advanced Packaging, May/Jun. 1995, pp 34–37.

Juan Burgos et al., "Achieving Accurate Thermal Characterization Using a CFD Code–A Case Study of Plastic Packages", IEEE Transactions on Components, Packaging, and Manufacturing Technology–Part A, vol. 18, No. 4, Dec. 1995, pp732–738.

"Joint Standard on BGA" Advanced Packaging, May/Jun. 1995, pp 16.

David Maliniak, "The Maturing of the BGA", Electronic Design, Apr. 1995, pp 20.

Electronic Packaging & Production, Mar. 1995.

J. Ewanich et al., "Development of a Tab (TCP) Ball Grid Array Package", Proceedings of the Technical Conference, 1995 International Electronics Packaging Conference, San Diego, CA, Sep. 1995, pp 588–594.

Mark Ferguson, "Ensuring High–Yield BGA Assembly" Circuits Assembly, Feb. 1995, pp 54–56.

Atila Mertol, "Application of the Taguchi Method on Robust Design of Molded 225 Plastic Ball Grid Array Packages", IEEE Transactions on Components, Packaging, and Manufacturing Technology–Part B: Advanced Packaging, vol. 18, No. 4, Nov. 1995, pp 734–743.

Bruce Freyman et al., "The Move to Perimeter Plastic BGA's" Surface Mount International, Proceedings of the Technical Program, San Jose, CA, Aug. 1995.

Bruce M. Guenin et al., "Analysis of a Thermally Enhanced Ball Grid Array Package", IEEE Transactions on Components, Packaging, and Manufacturing Technology–Part A, vol. 18, No. 4, Dec. 1995, pp 749–757.

Curtis Hart, "Vias in Pads" Circuits Assembly, Feb. 1995.

Gary B. Kromann et al., "Motorola's Power PC 603 and PowerPC 604 RISC Microprocessor: The C4/Ceramic Ball––Grid Array Interconnect Technology", IEEE, 45th Electronic Components & Technology Conference 1995, pp 1–27.

The Institute for Interconnecting and Packaging Electronic Circuits (IPC), Proceedings of the Technical Conference, Oct./Nov. 1995, Providence, RI.

Chris Schmolze et al., "SPICE Modeling Helps Enhance BGA Performance" Electronic Packaging & Production, vol. 25, No. 1, Jan. 1995.

Semiconductor Group Package Outlines Reference Guide, Texas Instruments Incorporated, 1995.

Shailesh Mulgaonker et al., "An Assessment of the Thermal Performance of the PBGA Family", 1995 Proceedings, Eleventh IEEE Semiconductor Thermal Measurement and Mangement Symposium, pp 17–27.

Larry Sirois, "Assembly: Dispensing for BGA", Advanced Packaging, May/Jun. 1995, pp 38–41.

John Tuck, "BGA Technology Branches Out" Circuit Assembly, vol. 6, No. 2, Feb. 1995.

H. Xie et al., "Thermal Solutions to Pentium Processors in TCP in Notebooks and Sub–Notebooks" 1995 IEEE, pp 201–210.

Wai–Yeung Yip et al., "Package Characterization of a 313 Pin BGA" Proceedings of the Technical Program, Nepcon West '95 Conference, Anaheim, CA, Feb./Mar. 1995, pp 1530–1540.

Ed Zamborsky, "BGAs in the Assembly Process", Circuits Assembly, vol. 6, No. 2, Feb. 1995, pp 60–64.

Marie S. Cole et al., "A Review of Available Ball Grid Array (BGA) Packages", Surface Mount Technology Association, Journal of Surface Mount Technology, Jan. 1996, pp 4–11.

Glenn Dody et al., "BGA Assembly Process and Rework", Surface Mount Technology Association, Journal of Surface Mount Technology, Jan. 1996, pp 39–45.

Theo I. Ejim et al., "Designed Experiment to Determine Attachment Reliability Drivers for PBGA Packages" Surface Mount Technology Association, Journal of Surface Mount Technology, Jan. 1996, pp30–38.

Bruce Freyman et al., "The Move to Perimeter Plastic BGAs" Surface Mount Technology Association, Journal of Surface Mount Technology, Jan. 1996, pp 19–29.

Michael Hundt, "Thermal Enhancements of Ball Grid Arrays", Proceedings of the Technical Program,, Nepcon West '96 Conference, Anaheim, Ca, Feb. 1996.

Patrick Johnson "Printed Circuit Board Design Guidelines for Ball Grid Array Packages" Surface Mount Technology Association, Journal of the Surface Mount Technology, Jan. 1996, pp 12–18.

Paul Mescher, The Evolution of BGA, Advanced Packaging, Mar./Apr. 1996, pp 16–18.

Semiconductor Group Packaging Outlines, Texas Instruments, Dec. 1996, Plastic Ball Grid Array.

E. Jan Vardaman et al., "Worldwide Trends in Ball Grid Array Developments" Proceedings of the Technical Program, Nepcon West '96 Conference, Anaheim, CA, Feb. 1996.

"Pad Array Improves Density" Electronic Packaging & Production, Jun. 1993.

Suzanne Fauser et al., "High Pin–Count PBGA Assembly", Circuits Assembly, Feb. 1995.

Michael Barrow, "Perimeter Matrix Ball Grid Array Circuit Package with a Populated Center", International Search Report, PCT/US97 /03511, Mar. 1996.

LSI Logic Corporation, Package Selector Guide, 1991–1995.

LSI Logic Corporation, Package Selector Guide.

LSI Logic Corporation, Package Selector Guide, 1994–1995.

Julian Partridge et al., "Organic Carrier Requirements for Flip Chip Assemblies" Surface Mount Technology Association, Journal of Surface Mount Technology, Jul. 1994, pp 15–20.

Bruce Freyman et al., "Surface Mount Process Technology for Ball Grid Array Packaging" Surface Mount Technology Association, Journal of Surface Mount Technology, Jul. 1994, pp 27–31.

Randy Johnson et al., "Thermal Characterization of 140 and 225 Pin Ball Grid Array Packages", Nepcon East '93 Conference, Boston, Ma, Jun. 1993.

Semiconductor Group Package Outlines Reference Guide, Texas Instruments Incorporated, Plastic Ball Grid Array Drawing, 1995.

Andrew Mawer et al., "Calculation of Thermal Cycling and Applications Fatigue Life of the Plastic Ball Grid Array (BGA) Packaging", Proceedings of the 1993 International Electronics Packaging Conference, vol. 2, San Diego, Ca, Sep. 1993.

Charles E. Bauer, "Partitioning and Die Selection Strategies for Cost Effective MCM Designs" Surface Mount Technology Association, Journal of Surface Mount Technology, Oct. 1994, pp 4–9.

Andrew J. Mawer et al., "Plastic Ball Grid Array Solder Joint Reliability Considerations", Surface Mount Technology Association, Journal of Surface Mount Technology, Oct. 1994, pp 16–32.

Dr. W.C. Mak et al., "Increased SOIC Power Dissipation Capability Through Board Design and Finite Element Modeling" Surface Mount Technology Association, Journal of Surface Mount Technology, Oct. 1994, pp. 33–41.

Philip E. Rogren, "MCM–L Built on Ball Grid Array Formats", Surface Mount International, Proceedings of the Technical Program, San Jose, Ca, Aug./Sep. 1994.

James J. Clementi et al., "Flip–Chip Assembly on CQFP Using No–Clean Processing" Proceedings 1995 International Flip Chip, Ball Grid Array, Tab and Advanced Packaging Symposium, San Jose, Ca, Feb. 1995.

Andrew Mawerand et al., "Reliable BGAs Take on Extra Routes" Electronic Engineering Times 98, Interconnects & Packaging, Issue 816, Sep. 194.

Johnathan L. Houghten, "Plastic Ball–Grid Arrays Continue to Evolve", Feb. 6, 1995 issue of Electronic Design, vol. 43, No. 3, pp. 5, 7, 141–146, Penton Publishing Inc., Cleveland, OH.

Compaq, "Compaq's Proposed BGA Package for Low Cost High Volume Products" (one page), Nov. 8, 1993.

LSI Logic, Package Selector Guid 1994–1995, cover page, chapter cover page, pp. 8–27 and 8–31.

Semiconductor Group Package Outlines Reference Guide, First Edition 1995, cover page and pp 6–20, Arrow Schweber.

BGA Product Guide Updates, Amkor/ Anam, Jun. 1994.

Steve Liew et al., Fax to Mike Barrow regarding BGA Details, Dec. 21, 1994, pp. 1–2.

Bruce Freyman et al. "Surface Mount Process Technology for Ball Grid Array Packaging", Surface Mount International, Aug. 29–Sep. 2, 1993, Amkor Electronics Inc., San Jose, California, pp. 81–85.

Johnathan L. Houghten "Plastic Ball–Grid Arrays Continue to Evolve", Electronic Design Magazine, Feb. 6, 1995, pp. 141–146, vol. 43, No. 3, Penton Publishing.

LSI Logic Corporation, Package Selector Guide 1994–1995, Second Edition, Milpitas, California.

LSI Logic Corporation, Package Selector Guide 1994–1995 Errata.

Semiconductor Group Package Outlines Reference Guide, Texas Instruments Incorporated, Plastic Ball Grid Array Drawings, 1995.

* cited by examiner

US 6,747,362 B2

PERIMETER MATRIX BALL GRID ARRAY CIRCUIT PACKAGE WITH A POPULATED CENTER

This is a Continuation Application of prior Application Ser. No. 08/959,546 filed Oct. 24, 1997 now U.S. Pat. No. 5,894,410 which is a Continuation application of prior application Ser. No. 08/623,355 filed Mar. 28, 1996 now abandoned entitled PERIMETER MATRIX BALL ARRAY CIRCUIT PACKAGE WITH A POPULATED CENTER.

BACKGROUND OF THE INVENTION

1. Field of the Invention

The present invention relates to an integrated circuit package.

2. Description of Related Art

Integrated circuits are typically mounted to a package that is soldered to a printed circuit board. One such type of integrated circuit package is a ball grid array ("BGA") package. BGA packages have a plurality of solder balls located on a bottom external surface of a package substrate. The solder balls are reflowed to attach the package to the printed circuit board. The integrated circuit is mounted to a top surface of the package substrate, and electrically coupled to the solder balls by internal routing within the package.

FIG. 1 shows a solder ball array of a prior art BGA package 2. The solder balls 4 are arranged in a two-dimensional pattern across the bottom surface of the package. The integrated circuit 6 is centrally located on the opposite side of the package 2. The package 2 is typically constructed from a material which has a coefficient of thermal expansion that is different than the thermal expansion coefficient of the integrated circuit. It has been found that the differential thermal expansion between the integrated circuit and the package will induce temperature related stresses that fail solder joints in an area which corresponds to the outer edges of the circuit die.

FIG. 2 shows a BGA package 2 of the prior art which has an outer two dimensional array of solder balls 4. The solder balls 4 are located away from the package area that is beneath the integrated circuit 6. Locating the solder balls 4 away from the integrated circuit 6 reduces the thermal stresses on the solder joints created by the differential expansion between the package and the integrated circuit. Although effective in reducing solder failure the outer array pattern limits the input/output (I/O) of the package. Additionally, the integrated circuit generates heat which conducts through the solder balls and into the printed circuit board. Locating the solder balls at the outer perimeter of the package increases the thermal path through the package substrate. The longer path increases the thermal impedance of the package and the junction temperature of the integrated circuit. It would be desirable provide a BGA package that has a longer product life, lower thermal impedance and higher I/O than BGA packages of the prior art.

SUMMARY OF THE INVENTION

The present invention is a ball grid array ("BGA") integrated circuit package which has an outer two-dimensional array of solder balls and a center two-dimensional array of solder balls located on a bottom surface of a package substrate. The solder balls are typically reflowed to mount the package to a printed circuit board. Mounted to an opposite surface of the substrate is an integrated circuit that is electrically coupled to the solder balls by internal routing within the package. The outer array of solder balls are located outside the dimensional profile of the integrated circuit to reduce solder stresses induced by the differential thermal expansion between the integrated circuit and the substrate. The center solder balls are typically routed directly to ground and power pads of the package to provide a direct thermal and electrical path from the integrated circuit to the printed circuit board.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
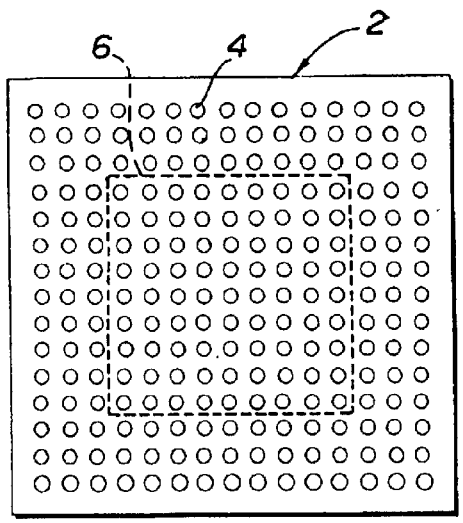
FIG. 1 is a bottom view of a ball grid array integrated circuit package of the prior art.
Figure 2:
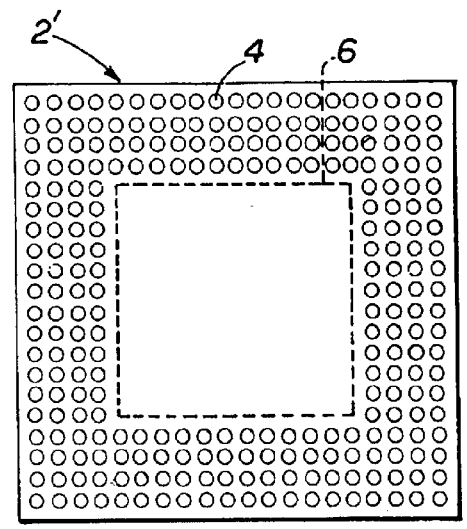
FIG. 2 is a bottom view of a ball grid array integrated circuit package of the prior art.
Figure 3:
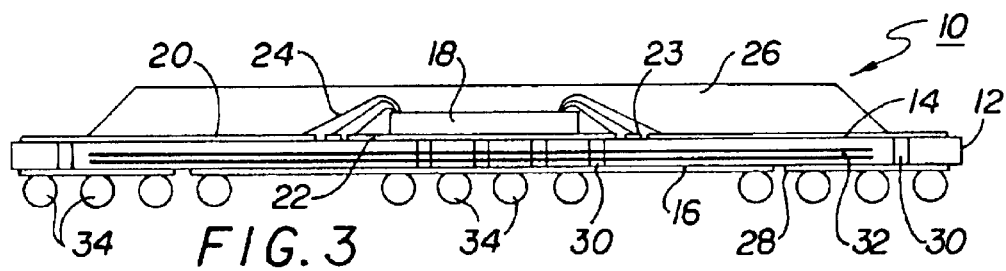
FIG. 3 is a side cross-sectional view of a ball grid array package of the present invention.
Figure 4:
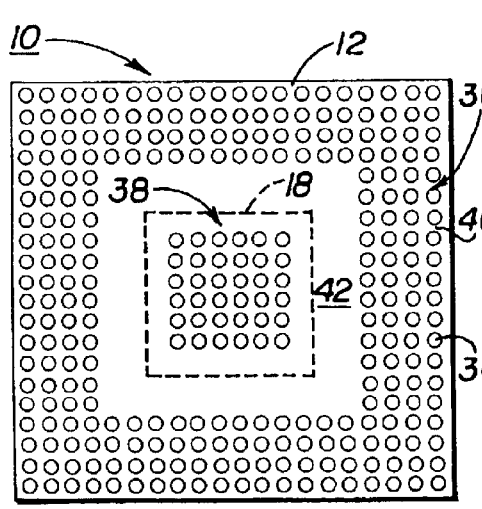
FIG. 4 is a bottom view of the package shown in FIG. 3.

Referring to the drawings more particularly by reference numbers, FIGS. 3 and 4 shows a ball grid array ("BGA") integrated circuit package 10 of the present invention. The package 10 includes a substrate 12 that has a top surface 14 and an opposite bottom surface 16. Mounted to the top surface 14 of the substrate 12 is an integrated circuit 16. The integrated circuit 18 is typically a microprocessor. Although a microprocessor is described, it is to be understood that the package 10 may contain any electrical device(s).

The top surface 14 of the substrate 12 has a plurality of bond pads 20 and a ground bus 22. The substrate 12 may also have a separate power bus 23 concentrically located about the integrated circuit 18 and ground pad 22. The integrated circuit 18 is coupled to the bond pads 20 and busses 22 and 23 by bond wires 24. The integrated circuit 16 is typically enclosed by an encapsulant 26. Although bond wires 24 are shown and described, the integrated circuit 18 can be mounted and coupled to the substrate with solder balls located on the bottom surface of the circuit die in a package and process commonly referred to as "C4" or "flip chip" packaging.

The bottom surface 16 of the substrate 12 has a plurality of contact pads 28. The contact pads 28 are coupled to the bond pads 20 and busses 22 and 23 by vias 30 and internal routing 32 within the substrate 12. The substrate can be constructed with conventional printed circuit board, or co-fired ceramic, packaging processes known in the art.

A plurality of solder balls 34 are attached to the contact pads 28 with known ball grid array processes. The solder balls 34 are typically reflowed to attach the package 10 to a printed circuit board (not shown).

The contact pads 28 are arranged in an outer two-dimensional array 36 and a center two-dimensional array 38. Each array contains a plurality of contact pads 28 that are separated from each other by a number of dielectric spaces 40. The outer array 36 is separated from the center array 38 by a dielectric area 42. The outer array 36 is preferably located outside of the outer dimensional profile of the integrated circuit 18. In this manner the solder joints of the outer array 36 are not subjected to stresses created by the difference in the coefficient of thermal expansion of the integrated circuit 18 and the expansion coefficient of the substrate 12. The center array 38 is located near the origin of the integrated circuit 16 in an area that does not undergo as much thermal expansion as the outer edges of the circuit die. Therefore the solder stresses created by the differential thermal expansion is minimal in the area of the center array 38. The separated arrays provide a pattern that minimizes the stresses on the solder joints.

The outer array 36 is typically coupled to the signal lines of the integrated circuit 16. The center array 38 is preferably coupled to the ground bus 20 and power bus 23 of the substrate 12. The vias 30 that couple the busses 22 and 23 to the center contact pads 38 provide a direct thermal path through the substrate. The direct path lowers the thermal impedance of the package 10 and the junction temperature of the integrated circuit 18. Additionally, the short electrical path lowers the self-inductance and reduces the switching noise of the integrated circuit 18.

In the preferred embodiment, the package 10 contains 292 contact pads 28 on a 27 by 27 millimeter (mm) wide substrate 12, or 352 contact pads 28 on a 35 by 35 mm substrate 12. The dielectric space 40 between the contact pads 28 is typically 1.27 mm. The package 10 typically has a height of approximately 2.5 mm.

The package 10 is assembled by attaching the solder balls 34 to the contact pads 28. The integrated circuit 18 is mounted and coupled to the substrate 12. The integrated circuit 18 is then enclosed by the encapsulant 26. The BGA package 10 is typically shipped to an end user that mounts the package 10 to a printed circuit board by reflowing the solder balls 34.

Figure 5:
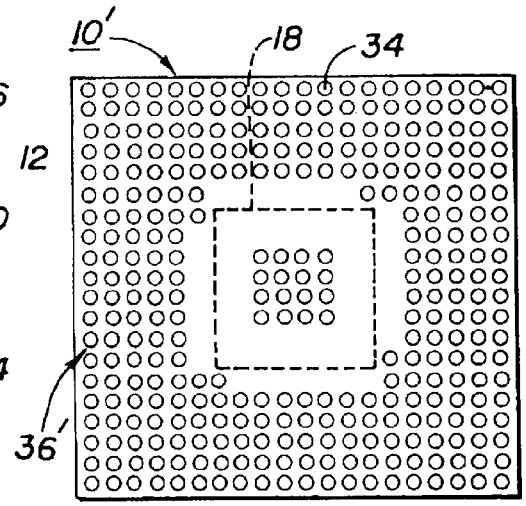
FIG. 5 is a bottom view of an alternate ball grid array package.

FIG. 5 shows an alternate embodiment of a package 10' which has five or six rows of contact pads 28 in the outer array 36' of the substrate 12'. The additional pads 28 increase the input/output (I/O) of the package 10. The outer array 36' is preferably outside the outer dimensional profile of the integrated circuit 18 to minimize the stresses on the solder joints. The package 10' may provide 324 contact pads 28 on a 27 by 27 mm substrate 10. The longer rows of the package 60 provide the approximate I/O of a 35 by 35 mm package, within the footprint of a 27 by 27 mm package.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A semiconductor package, comprising:
    a substrate that includes a top surface and an exposed external opposite surface including a first, inner region, a second, outer region around the inner region, and a third region that separates the first and second regions; and
    a plurality of contacts including a first plurality of contacts and a second plurality of contacts, said first plurality of contacts located in a four-by-four matrix in the first region, and said second plurality of contacts located in the second region such that a smallest distance between adjacent contacts in both the first and second regions are smaller than a distance between the first and second regions, wherein the third region does not have any contacts located therein.

2. The semiconductor package of claim 1, wherein the smallest distance between adjacent contacts in the first region is equal to the smallest distance between adjacent contacts in the second region.

3. The semiconductor package of claim 1, wherein the plurality of contacts comprises a plurality of contact pads.

4. The semiconductor package of claim 3 further comprising a plurality of solder balls attached to said contact pads of said first and second plurality of contacts.

5. The semiconductor package of claim 1 wherein each of the second plurality of contacts is contained within a dimensional profile of an integrated circuit coupled to the top surface of the substrate.

6. The semiconductor package of claim 1 wherein said top surface of said substrate has a plurality of bond pads.

7. The semiconductor package of claim 6 wherein said top surface of said substrate has a ground bus that is connected to said second plurality of contacts by a plurality of vias that extend through said substrate.

8. The semiconductor package of claim 6 wherein said top surface of said substrate has a power bus that is connected to said second plurality of contacts by a plurality of vias that extend through said substrate.

9. The semiconductor package of claim 1 wherein said first plurality of contacts comprises at least five rows of contacts.

10. A semiconductor package, comprising:
    a substrate that includes a top surface having a plurality of bond pads, and an exposed external opposite surface including an inner region, an outer region, and a middle region that separates the inner and outer regions;
    a plurality of contacts including a first plurality of contacts and a second plurality of contacts, said first plurality of contacts located in the outer region, and said second plurality of contacts located in the inner region such that the smallest distances between adjacent contacts in the inner and outer regions are smaller than a distance between the inner and outer regions, wherein the middle region is free of contacts; and
    an integrated circuit that is mounted to said top surface of said substrate and electrically coupled to said plurality of bond pads, wherein said first and second plurality of contacts are located respectively outside and inside a dimensional profile of said integrated circuit.

11. The semiconductor package of claim 10, wherein the distances between adjacent contacts in the inner region are equal to the distances between adjacent contacts in the outer region.

12. The semiconductor package of claim 10 further comprising a plurality of electrically conductive members attached to said plurality of contacts of said first and second plurality of contacts.

13. The semiconductor package of claim 10 wherein said top surface of said substrate has a ground bus that is coupled to said integrated circuit and connected to said second plurality of contacts by a plurality of vias that extend through said substrate.

14. The semiconductor package of claim 10 wherein said top surface of said substrate has a power bus that is coupled to said integrated circuit and connected to said second plurality of contacts by a plurality of vias that extend through said substrate.

15. The semiconductor package of claim 10 further comprising an encapsulant enclosing said integrated circuit.

16. An integrated circuit package for an integrated circuit which has a dimensional profile, comprising:
    a substrate that includes a top surface, and an exposed external opposite surface defined by a first region that is substantially equal to the dimensional profile of the integrated circuit, a second region, and a third region that separates the first and second regions; and a plurality of contacts including a first plurality of contacts and a second plurality of contacts, said first plurality of contacts located within the second region, and said second plurality of contacts located in the first region such that a first smallest distance between adjacent contacts in the first region is smaller than a second smallest distance between the first and second regions, said third region being a contact free region.

17. The integrated circuit package of claim 16, wherein a distance between adjacent contacts in first region is the same as the distance between adjacent contacts in the second region.

18. The integrated circuit package of claim 16 further comprising a plurality of solder balls attached to said plurality of contacts.

19. The integrated circuit package of claim 16 wherein said top surface of said substrate has a ground bus that is connected to said second plurality of contacts by a plurality of vias that extend through said substrate.

20. The integrated circuit package of claim 16 wherein said top surface of said substrate has a power bus that is connected to said second plurality of contacts by a plurality of vias that extend through said substrate.

21. A semiconductor package, comprising:

a substrate which has a top surface and an exposed external bottom surface, said external bottom surface having a plurality of contact pads, said plurality of contact pads consisting only of:
an outer array of contact pads, each of said contact pads separated from each other by a first distance;
a center array of contact pads, arranged in a four-by-four array, each of said contact pads separated by a second distance, said center array of contact pads being separated from said outer array of contact pads by a third distance which is larger than said first and second distances; and
a plurality of conductive contacts attached to said contact pads of said substrate.

22. The semiconductor package of claim 21 wherein said outer array of contact pads is located outside an outer dimensional profile of an integrated circuit coupled to the top surface of said substrate.

23. The semiconductor package of claim 21 wherein said center array of contact pads is located inside the outer dimensional profile of an integrated circuit coupled to the top surface of said substrate.

24. The semiconductor package of claim 21 wherein said outer array of contact pads is located outside an outer dimensional profile of an integrated circuit coupled to the top surface of said substrate, and wherein said center array of contact pads is located inside the outer dimensional profile of said integrated circuit.

25. The semiconductor package of claim 21 wherein a distance between adjacent contact pads in said outer array is the same as the distance between adjacent contact pads in said center array.

26. The semiconductor package of claim 21 wherein the smallest distance between adjacent contact pads in the outer array is smaller than the distance between the outer array of contact pads and the center array of contact pads.

27. The semiconductor package of claim 21 wherein the top surface of said substrate has a ground bus that is connected to said center array of contact pads by a plurality of vias that extend through said substrate.

28. The semiconductor package of claim 21 wherein the conductive contacts are solder balls.

29. A semiconductor package, comprising:

a substrate that includes a top surface having a bus and an exposed external opposite surface including a first, inner region, a second, outer region around the inner region, and a third region that separates the first and second regions;

a plurality of contacts including a first plurality of contacts and a second plurality of contacts, said first plurality of contacts located in a four-by-four matrix in the first region, and said second plurality of contacts located in the second region such that a smallest distance between adjacent contacts in both the first and second regions are smaller than a distance between the first and second regions, wherein the third region does not have any contacts located therein; and a plurality of via interconnecting the first bus with a plurality of the first contacts.

30. The semiconductor package of claim 29 wherein the top surface has a second bus, further comprising a plurality of vias interconnecting the second bus with a plurality of the second contacts.

* * * * *